United States Patent [19]
Gatto et al.

[11] 4,089,044
[45] May 9, 1978

[54] HOUSING ASSEMBLY FOR MINIATURIZED BATTERY OPERATED ELECTRICAL APPARATUS

[75] Inventors: Donald Frederick Gatto, Sunrise; William Karl Strobel, Lauderdale Lakes; Leo Vincent Krolak, Plantation, all of Fla.; Pete Varasse, Wichita, Kans.

[73] Assignee: Motorola, Inc., Schaumburg, Ill.

[21] Appl. No.: 777,735

[22] Filed: Mar. 15, 1977

[51] Int. Cl.² .............................................. H05K 1/04
[52] U.S. Cl. ...................................... 361/422; 325/353
[58] Field of Search ................ 361/422, 399; 325/352, 325/353, 361, 119

[56] References Cited
U.S. PATENT DOCUMENTS

| | | | |
|---|---|---|---|
| 3,636,089 | 1/1972 | Ditthardt et al. | 361/399 |
| 3,693,089 | 9/1972 | Hutchinson et al. | 325/353 |
| 3,748,583 | 7/1973 | Andersen et al. | 325/353 |

*Primary Examiner*—David Smith, Jr.
*Attorney, Agent, or Firm*—Donald Southard; James W. Gillman

[57] ABSTRACT

An improved housing assembly for housing miniaturized electrical or electronic apparatus, such as a radio receiver or monitor, is disclosed wherein a single piece housing is provided, open at the top for receiving an associated electrical chassis with self-contained battery compartment and a sound transducer. A control panel attached to the electrical chassis cooperates to overfit the open end of said housing to complete the overall assembly. The assemblage of the housing apparatus requires no screws, fasteners or special tools as the respective component parts effect a snap-fit with one another. A novel interlocking arrangement between chassis assembly and housing disquises the latching interfit therebetween, which nevertheless may be released by the insertion of a simple blade tool at the proper location. Complete shock mounting and protection from dust and dirt is effected by resilient gasket elements in cooperation with the housing and chassis assembly. A transparent lens cover is incorporated on a portion of the bottom panel to overlie an information placard referencing operational data but which, in addition, includes features which show if unauthorized access has been effected to the internal chassis assembly.

7 Claims, 8 Drawing Figures

HOUSING ASSEMBLY FOR MINIATURIZED BATTERY OPERATED ELECTRICAL APPARATUS

BACKGROUND OF THE INVENTION

The present invention relates in general to housing assemblies and in particular to an improved, weather-resistant, one-piece housing assembly especially suited for miniaturized electrical or electronic apparatus which requires no additional fasteners for assemblage of the overall structure and wherein a hidden latching arrangement provides protection from unauthorized entry into the interior of such apparatus but, if breached, effects a visual indication that access has been effected.

Housing assemblies for miniaturized electrical or electronic apparatus which utilize molded plastic component parts are, of course, known in the art. For the most part, however, such assemblies require somewhat elaborate interfitting with one another and are maintained in the assembled relation by screws or other fasteners and, in most instances, require the use of special tools of some sort.

Not only is it time consuming to secure each of such fastener devices, but they are quite easily misplaced or lost. Moreover, the very presence of such fastener devices often invite disassembly of the apparatus by unauthorized individuals, such as a curious employee, being but a mere temporary custodian of the apparatus. Nonetheless, partial access must be available for simple battery replacement from time to time. Obviously, it should be possible to effect the latter without disassembly of the housing proper.

Additionally, if not otherwise discouraged, mere users or custodians may, and frequently do, effect unauthorized entry into the interior of the radio apparatus which may well result in damage to delicate component parts. Unauthorized entry should be discouraged by all but certain skilled repair or maintenance personnel. Moreover, it would be a significant advantage to have some visual indication left in evidence whenever such authorized entry is made into the interior of radio housing. The prior art devices frequently exhibit little, or in some cases, no shock mounting for the internal radio chassis and assembly at all. Insufficient shock mounting can prove disasterous in terms of reliability since rough handling and droppage can quite likely be guaranteed to occur.

SUMMARY OF THE INVENTION

Accordingly, it is an object of the present invention to provide an improved housing assembly for miniaturized electrical apparatus which includes a single, one-piece housing conveniently molded from a suitable plastic material.

Another object of the present invention is to provide an improved housing assembly of the foregoing type wherein the associated electrical chassis is insertable through an open end and retained therein by a snap-fit action.

Yet another object of the present invention is to provide an improved housing assembly of the foregoing type wherein the housing and control panel are interfitted with one another and retained without additional fasteners or other securing devices required.

Still another object of the present invention is to provide an improved housing assembly of the foregoing type wherein a battery compartment is provided on the associated electrical chassis and accessible at all times without further disassembly of the housing apparatus.

It is yet another object of the present invention to provide an improved housing assembly of the foregoing type wherein resilient gasket means are included to provide for both shock mounting of the associated electrical apparatus and as a weather resistant seal for protection from the deleterious effect of dust, dirt and the like.

An additional object of the present invention is to provide an improved housing assembly of the foregoing type wherein a permanent, visual indication is made should there be an attempt at unauthorized entry into the interior of the housing, which indication remains until appropriate replacement is effected of an associated component part.

In practicing the invention, a one-piece housing is molded from a suitable plastic material for accommodating an associated electrical apparatus with self-contained battery compartment, operating controls and a sound transducer. The housing is adapted to receive the chassis through an open top in the housing with a control panel attached to the chassis over fitting the housing top, which control panel includes a plurality of acoustical openings therein to permit passage of reproduced sound signals by the associated transducer. Resilient gasket members are provided at the bottom and top of the inserted chassis to provide both shock mounting therefor and as a protection from the deleterious effects of dust, dirt and the like. Moreover, respective spring clips on the radio chassis which extend downwardly and make a snap-fit with laterally extending tabs on the housing bottom surface. This latch mechanism is completely hidden from view and, further, as covered by a largely transparent lens overfitting a placard of informational or operational information. The transparent lens includes a plurality of L-shaped tabs or hook like members which snap-fit into the housing body. The lens component cannot be pried loose or otherwise removed without breakage of one or more of these hook members, thereby giving a permanent and visual indication whenever an attempt is made at an authorized entry into the interior of the radio apparatus.

BRIEF DESCRIPTION OF THE DRAWINGS

The features of the present invention which are believed to be novel are set forth with particularity in the appended claims. The invention itself, however, together with further objects and advantages thereof, may be best understood by reference to the accompanying drawings, in which:

DESCRIPTION OF THE PREFERRED EMBODIMENT

Figure 2:
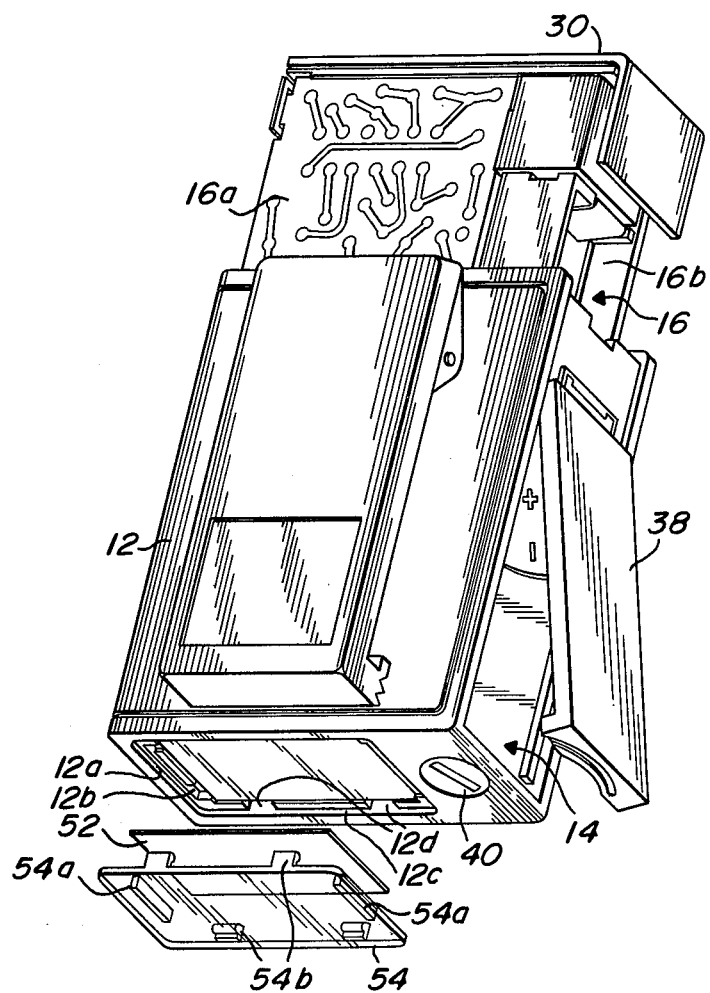
FIG. 2 is a partially exploded view of a housing assembly and associated electrical chassis, which housing assembly has been constructed in accordance with the present invention.

Referring now to the drawings, a housing assembly 10 is shown in exploded view in FIG. 2, which housing assembly has been constructed in accordance with the present invention. The assembly 10 includes a one-piece housing 12, molded from a suitable plastic material, such as a thermoplastic resin or the like. As illustrated, housing 12 includes front, back, bottom and side walls but an open top. A battery compartment 14 is provided at the side of housing 12, the operation of which will be described in more detail subsequently.

Housing 12 is adapted to receive an associated electrical chassis assembly, as identified at 16, into the interior thereof. Chassis assembly 16 may include a pair of chassis printed circuit boards 16a and 16b on which appropriate electrical or electronic components are operationally mounted and interconnected (best seen in FIG. 3). The identity and description of the operational characteristics of such component parts are deemed not to be necessary, since they form no specific part of the present invention as such. Such a chassis assembly, however, would conventionally include, inter alia, an associated sound transducer element 18, the self-contained battery compartment assembly 14 and a power and control switch 20.

Figure 3:
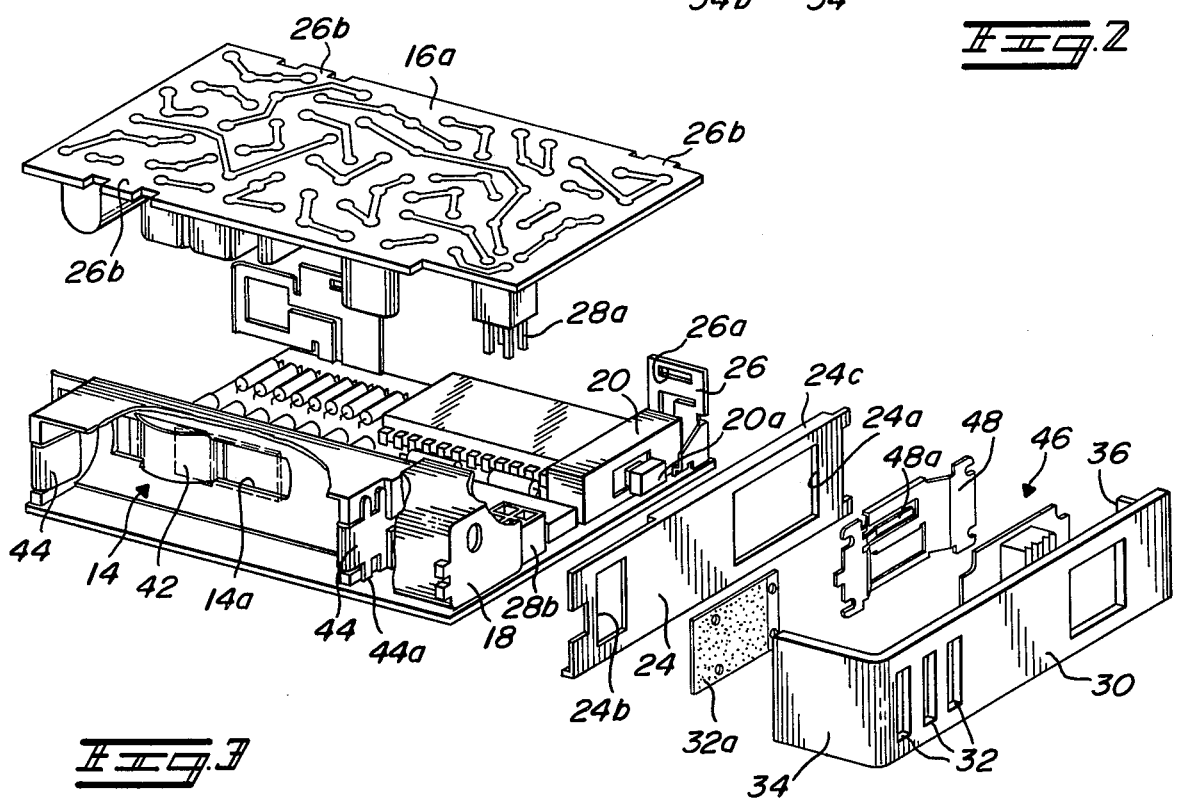
FIG. 3 is a further partially exploded view of the electrical chassis assembly and control panel shown in FIG. 2.
Figure 4:
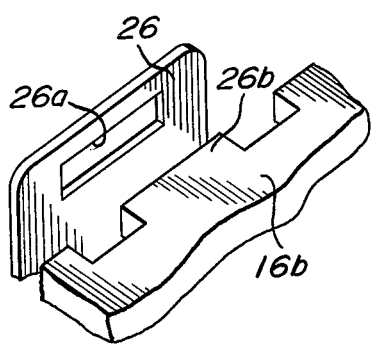
FIG. 4 is an enlarged fragmentary view of a portion of the electrical chassis showing a detail of the interconnection and mounting of the two printed circuit boards each to the other.

Prior to the insertion of chassis assembly 16 into housing 12, a resilient gasket member 22 is inserted in the bottom of housing 12. Still another resilient gasket member 24 is positioned between the chassis assembly 16 and the control panel 30 (as shown in FIG. 3). Gaskets 22 and 24 form a part of the weather-resistant sealing of the interior of housing 12 as well as serving a shock mounting capability for the chassis assembly 16 as a whole as will be described in more detail subsequently.

It should be noted that chassis printed circuit boards 16a and 16b are maintained in an assembled, sandwiched relation with respect to one another by a plurality of slotted, spring clips 26 soldered or otherwise secured edgewise to one of the printed circuit boards say, for example, board 16a. Each of the spring clips include a substantially rectangular opening or slot 26a, although the precise shape is in no way critical. The other printed circuit board, 16b in this instance, includes a corresponding plurality of tabs 26b which makes a snap-fit into the slots 26a to thereby maintain the boards 16a and 16b in their aforementioned sandwiched, assembled relation. Electrical interconnection between the two printed circuit boards 16a and 16b is effected by the connector assembly 28, consisting of a female portion 28 mounted on one board, say printed circuit board 16a, and the male portion 28b mounted on the other, or board 16b. Connector 28 further provides a support function such that a spring clip 26 is not necessary at this chassis location.

Figure 8:
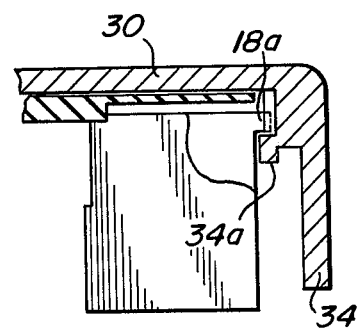
FIG. 8 is an enlarged fragmentary view in cross-section showing the detail in attaching the control panel to the chassis assembly.
Figure 7:
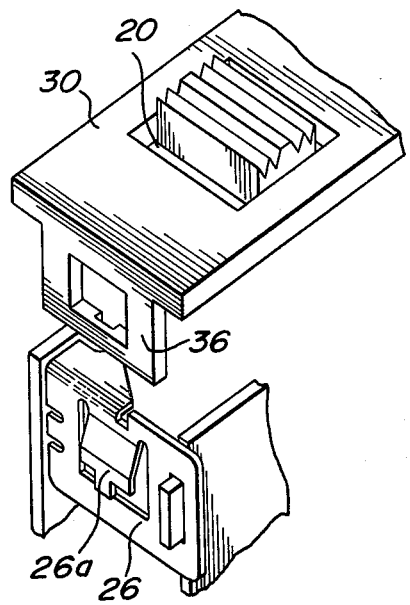
FIG. 7 is an enlarged fragmentary view in perspective showing the spring clip attached to the top portion of the electrical chassis for engaging and locking the control panel thereto.

As shown in FIG. 2, a control panel 30 is affixed to chassis assembly 16, which control panel, upon insertion of chassis 16 into housing 12, overlies the top of housing 12. Control panel 30 includes a plurality of apertures 32, serving as an acoustical grille for passage of sound waves, and a slide bar actuator 46 for interfitting with a controlling switch 20. Control panel 30 further includes a downwardly extending side flange 34. Flange 34 in turn includes a projection 34a on the inner surface thereof which provides engagement with a corresponding projection 18a on the transducer 18 (best seen in FIG. 8). The end of control panel 30 remote from side flange 34 includes a U-shaped bracket 36, which is intended to engage a resilient finger 26a, forming a part of spring clip 26, as illustrated in FIG. 7.

As further seen in FIG. 3, gasket member 24 is interposed between control panel 30 and chassis assembly 16 and includes an opening 24a through which a portion of actuator 20 extends with an additional opening 24b permitting the passage of sound waves therethrough for exit at the acoustical grille structure 32. Further, gasket 24 includes side ribs 24c which overlap a portion of the chassis structure 16 and thereby ensure a secure weather-resistant seal against dust, dirt and the like.

Figure 1:
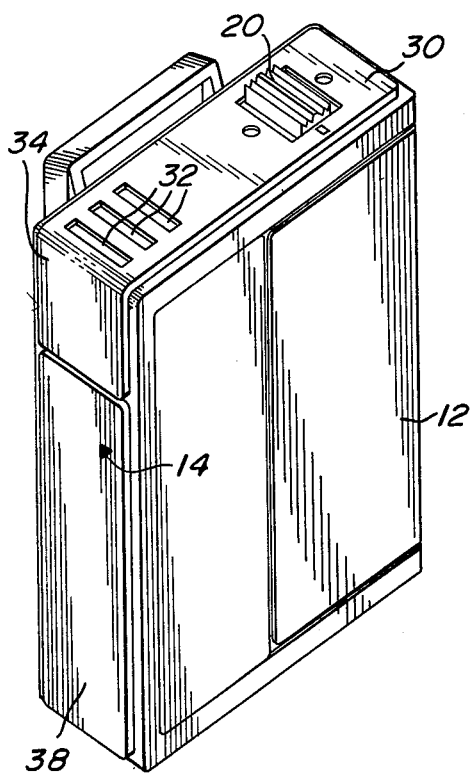
FIG. 1 is a frontal view in perspective of a fully assembled miniaturized, battery operated radio apparatus.

As will be noted in FIGS. 1 and 2, a cover 38 is aligned with the side flange 34 of control panel 30. The cover 38 is pivoted at one end (best seen in FIG. 2) so as to provide access to the battery compartment 14. A quarter turn screw control 40 in the bottom surface of housing 12 is rotated so as to release the cover 38 which is spring biased outwardly and pivoted at one end, as illustrated. When cover 38 is closed and latched by control 40, it forms a part of the overall decor or decorative pattern for the radio apparatus as a whole. When the control 40 is actuated to release the cover 38 outwardly, there is an automatic battery ejection feature provided by a spring clip 42 slideably mounted within the battery compartment 14. In addition, spring member 42 serves to prevent battery rattle when a battery is contained within compartment 14 by cover 38. Notwithstanding the foregoing, spring 42 is designed to be easily flexed to a flatened out position and slid upwardly into a slot 14a when servicing is to be done on the radio and it is desirable to have the chassis removed from the housing 12 but nevertheless not have associated battery ejected from the compartment 14. In assembly, battery compartment 14 includes a pair of spring clips 44 at respective ends thereof to provide the electrical power connections to the associated battery, which spring clips include leg portions 44a which mount into corresponding holes on the printed circuit board 16a and soldered thereto.

Figure 5:
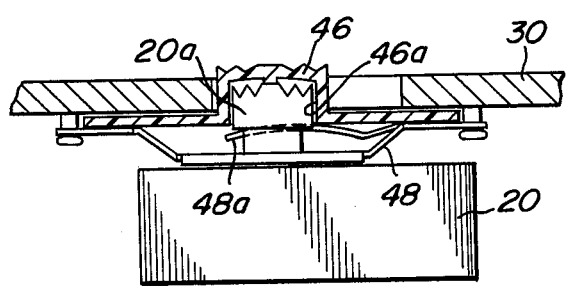
FIG. 5 is an enlarged fragmentary view in cross-section of the operating switch structure.
Figure 6:
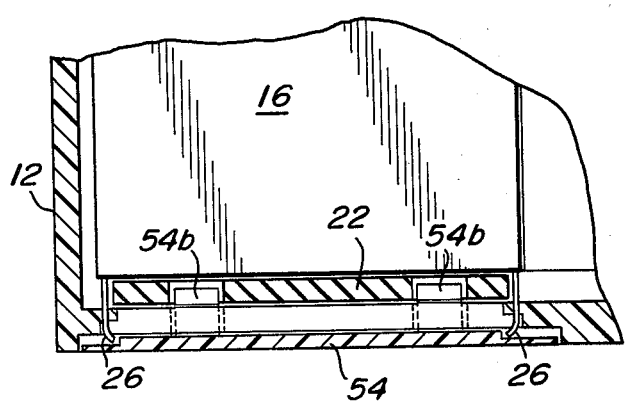
FIG. 6 is an enlarged fragmentary view in cross-section of the chassis and housing showing the interconnection thereof and bottom shock mounting.

From FIG. 5 it will be noted that switch actuator 20 includes a slideable bar 46 having serrations on the top thereof and a cavity 46a on the underside. An associated support bracket 48 is fastened to the under surface of the control panel 30 thereby containing the slide bar 46, which bracket includes a central resilient finger or spring 48a which permits bar 46 to be depressed a predetermined amount (for specific switch action provided in control switch 20), but upon release, to be biased upwardly to its initial position. As illustrated, the operating power and control switch 20 is intended to be positioned on chassis 16 in an appropriate location whereby the associated switch tab 20a locates within cavity 46a of slide bar 46 when control panel 30 is secured to chassis 16. In this way, the normal switching action for switch 20 may be effected through manipulation of slide bar 46 while the switch 20 itself is completely sealed from the ambient by the control panel 30 and its associated gasket member 24.

In assembly, upon insertion of chassis 16 into housing 12, the forward portions of spring clips 26 located at the bottom of chassis 16 insert within slots 12a formed in the housing bottom surface and make a snap-fit over the laterally projecting tabs 12b, thereby locking chassis 16 within housing 12. An identification plate, such as shown at 52, is intended for permanent attachment within the slight indentation 12c, included on the bottom surface of housing 12, such as by adhesive or the like. This identification plate includes such information as the FCC receiver certification data, frequency of operation, model number, serial number and the like. Additionally, a transparent lens assembly 54 is intended to cover the indentification plate 52. Lens 54 includes a pair of tabs 54a at respective ends thereof which insert within slots 12a and thereby render invisible or otherwise disguise the latching mechanism comprising the chassis spring clips 26a and the lateral tabs 12b of housing 12.

In addition, transparent lens 54 further includes a plurality of hook like finger members 54b, here shown as four in number, which insert within corresponding slots or apertures 12d of housing 12. These hook members after insertion move to a position where the bottom edge overlies a portion of housing 12 and thus locks in lens 54 within housing 12. The only discernable way of detaching lens 54 is to pry it away from housing 12 with a suitable blade tool or the like. The lens 54 becomes detached when hook members 54b are broken off. To facilitate this result, lens 54 is made of a suitable brittle plastic material. In any event, upon breakage of the hook members 54b of lens 54, a visual and permanent indication is provided that at least an attempt has been made to effect entry into the interior of the radio apparatus. This is an important circumstance to a manufacturer or other distributor maintaining a warranty on the serviceability of the particular apparatus in question. Of course, it will be realized that authorized service personnel will likewise break the lens assembly when removing the same for authorized service or maintenance of the radio apparatus. However, this will be by express authorization of the manufacturer or distributor. After service, a new lens assembly is inserted within the housing 12 and is ready once again to deter unauthorized access to the radio apparatus by other personnel. The cost of the lens assembly is minimal and a significant quantity can be kept in inventory at the servicing facility without any significant investment.

Accordingly, what is shown and disclosed is an improved one-piece housing assembly for a wide variety of radio or other miniaturized electronic apparatus wherein no screws or other special fasteners are required for assembly or disassembly thereof and wherein special means are provided to disguise the otherwise hidden latching mechanism of the internal radio chassis so as to deter unauthorized entry into the radio apparatus by uncontrolled or unsupervised personnel. If, nevertheless, the radio apparatus is tampered with, a visual and permanent indication is rendered whenever such authorized access is attempted, at least to the extent that the transparent lens assembly on the bottom surface of the radio housing is pried loose from the housing itself thereby breaking a part thereof and which cannot be repaired or otherwise disguised.

What is claimed:

1. An improved, weather-resistant housing assembly especially suited for battery operated miniaturized electrical apparatus comprising a chassis with operating control switch, self-contained battery compartment and transducer for reproducing audible signals, said housing assembly including in combination:
    a one-piece housing with bottom, front, back and side walls molded of a plastic material and open at the top for receiving the associated electrical apparatus chassis therein, said housing having slots in said bottom and a pivotable cover at one side overlying the self-contained battery compartment;
    a control panel for interfitting with said chassis and covering said housing top, said control panel including a plurality of apertures forming an acoustical grille, a slideable actuator bar to engage and interfit with the chassis operating control switch;
    means for weather sealing and shock mounting the apparatus chassis within said housing;
    hidden latch means for interlocking said chassis in assembled relation with said housing; and
    a retaining cover plate having a plurality of hook members for extending into and retained within said slots in said housing bottom to thereby disguise and render inaccessible said latch means, said cover plate being formed of a plastic material whereby said hook members readily break when said cover plate is attempted to be removed from engagement with said housing.

2. An improved, weather-resistant housing assembly in accordance with claim 1 wherein said battery compartment cover is releasably secured by a quarter-turn release mechanism and wherein said battery compartment includes means for automatic ejectment of an associated battery when said compartment cover is released.

3. An improved weather-resistant housing assembly in accordance with claim 2 wherein said automatic battery ejectment means may be disabled during servicing operations.

4. An improved weather-resistant housing assembly in accordance with claim 1 wherein said hidden latch means includes a pair of spring clips extending downwardly from said chassis assembly, each having an opening therein, said latch means further including corresponding openings in the bottom surface of said housing with a tab member extending laterally therein, said spring clips being inserted within said housing openings and making a snap-fit over said lateral housing tab members.

5. An improved weather-resistant housing assembly in accordance with claim 1 wherein said means for weather sealing and shock mounting the chassis within the housing includes a first resilient gasket affixed to the interior of said housing bottom and a second resilient gasket positioned between said chassis and said control panel, said weather sealing means further including a switch actuator bar slideably secured to said control panel, said actuator bar interfitting with the operating control switch mounted on said chassis.

6. An improved weather-resistant housing assembly in accordance with claim 1 wherein said chassis assembly comprises first and second printed circuit boards containing the operating components of said radio and wherein said boards are maintained in an operative, sandwiched relation by a plurality of spring clips whereby a tab member on one board is inserted into and maintained within an opening in the corresponding spring clip affixed to the other of said printed circuit boards.

7. An improved weather-resistant housing assembly in accordance with claim 1 wherein said control panel and battery compartment cover form a decorative feature and extend from the top of said housing around and down one side thereof.

* * * * *

UNITED STATES PATENT AND TRADEMARK OFFICE
CERTIFICATE OF CORRECTION

PATENT NO. : 4,089,044
DATED : May 9, 1978
INVENTOR(S) : Donald F. Gatto, Juan Milcuinas, William K. Strobel, Leo V. Krolak, Pete Varasse It is certified that error appears in the above-identified patent and that said Letters Patent are hereby corrected as shown below:

On the cover page, in item 75, please add to the list of inventors the further name of --Juan Milciunas Ft. Lauderdale, Florida--.

Signed and Sealed this

Twenty-eighth Day of November 1978

[SEAL]

Attest:

RUTH C. MASON
Attesting Officer

DONALD W. BANNER
Commissioner of Patents and Trademarks